(12) United States Patent
Lee et al.

(10) Patent No.: US 12,615,744 B2
(45) Date of Patent: Apr. 28, 2026

(54) ELECTRONIC DEVICE COMPRISING HEAT DISSIPATION STRUCTURE

(71) Applicant: SAMSUNG ELECTRONICS CO., LTD., Suwon-si (KR)

(72) Inventors: Yongseok Lee, Suwon-si (KR); Heecheul Moon, Suwon-si (KR); Sungyong Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 199 days.

(21) Appl. No.: 18/230,517

(22) Filed: Aug. 4, 2023

(65) Prior Publication Data

US 2023/0380111 A1 Nov. 23, 2023

Related U.S. Application Data

(63) Continuation of application No. PCT/KR2022/000342, filed on Jan. 10, 2022.

(30) Foreign Application Priority Data

Feb. 9, 2021 (KR) ........................ 10-2021-0018498

(51) Int. Cl.
*H05K 7/20* (2006.01)
*G06F 1/20* (2006.01)
(Continued)

(52) U.S. Cl.
CPC .......... *H05K 7/2039* (2013.01); *G06F 1/203* (2013.01); *H05K 7/20509* (2013.01);
(Continued)

(58) Field of Classification Search
CPC .. G06F 1/203; H05K 7/2039; H05K 7/20509; H04M 1/026
See application file for complete search history.

(56) References Cited

U.S. PATENT DOCUMENTS 6,972,959 B2 * 12/2005 Asai ................... H05K 7/20854
361/720
7,330,356 B2 * 2/2008 Park ................... H04M 1/0202
361/720
(Continued)

FOREIGN PATENT DOCUMENTS

CN 204362489 U 5/2015
CN 111372433 A 7/2020
(Continued)

OTHER PUBLICATIONS

Translation of the Written Opinion of the International Searching Authority for application PCT/KR2022/000342 (Apr. 9, 2022).*
(Continued)

*Primary Examiner* — Zachary Pape
(74) *Attorney, Agent, or Firm* — Sughrue Mion, PLLC

(57) ABSTRACT

According to various embodiments, an electronic device includes: a housing; a support member which is disposed in the inner space of the housing, and which includes a first surface oriented in a first direction and a second surface oriented in a second direction that is opposite to the first surface; at least one pattern formed to have a length in a designated direction in at least a part of the first surface and/or the second surface of the support member; and a heat dissipation coating layer stacked on the first surface and/or the second surface on which the at least one pattern is formed, wherein the at least one pattern may include a plurality of recesses spaced apart from each other at designated intervals and formed on the first surface and/or the second surface.

15 Claims, 17 Drawing Sheets

(51) Int. Cl.
     *H05K 5/03*          (2006.01)
     *H05K 5/04*          (2006.01)
     *H04M 1/02*          (2006.01)
(52) U.S. Cl.
     CPC .............. *H04M 1/026* (2013.01); *H05K 5/03*
                       (2013.01); *H05K 5/04* (2013.01)

(56)                References Cited

U.S. PATENT DOCUMENTS

| | | | | | |
|---|---|---|---|---|---|
| 7,800,904 | B2 * | 9/2010 | McGough | ........... | H01L 23/3735 |
| | | | | | 361/679.48 |
| 8,842,437 | B2 | 9/2014 | Chang | | |
| 10,298,059 | B2 | 5/2019 | Yio et al. | | |
| 2012/0002370 | A1 | 1/2012 | Ohsawa et al. | | |
| 2013/0058039 | A1 | 3/2013 | Lee | | |
| 2015/0062823 | A1 | 3/2015 | Seo et al. | | |
| 2015/0268704 | A1 * | 9/2015 | Chiriac | ................... | F28F 21/00 |
| | | | | | 165/185 |
| 2016/0044801 | A1 * | 2/2016 | Lee | ....................... | H04M 1/185 |
| | | | | | 361/679.55 |
| 2016/0106010 | A1 * | 4/2016 | Ito | ........................ | H05K 1/0209 |
| | | | | | 361/707 |
| 2016/0190407 | A1 | 6/2016 | Ahn et al. | | |
| 2016/0231787 | A1 | 8/2016 | Nguyen et al. | | |
| 2023/0200021 | A1 | 6/2023 | Sun et al. | | |

FOREIGN PATENT DOCUMENTS

| | | | |
|---|---|---|---|
| JP | 2010-212623 | A | 9/2010 |
| KR | 10-0698460 | B1 | 3/2007 |
| KR | 10-1049109 | B1 | 7/2011 |
| KR | 10-1094815 | B1 | 12/2011 |
| KR | 10-2013-0027330 | A | 3/2013 |
| KR | 10-1266432 | B1 | 5/2013 |
| KR | 10-1281974 | B1 | 7/2013 |
| KR | 10-1373710 | B1 | 3/2014 |
| KR | 10-1479536 | B1 | 1/2015 |
| KR | 10-1777918 | B1 | 9/2017 |
| KR | 10-2018-0125269 | A | 11/2018 |
| KR | 10-1997557 | B1 | 7/2019 |
| KR | 10-2114614 | B1 | 5/2020 |
| KR | 10-2208503 | B1 | 1/2021 |
| WO | 2018/212563 | A1 | 11/2018 |

OTHER PUBLICATIONS

Communication dated May 23, 2024, issued by the European Patent Office in counterpart European Application No. 22752889.0.
Written Opinion (PCT/ISA/237) issued Apr. 19, 2022 from the International Searching Authority in International Application No. PCT/KR2022/000342.
International Search Report (PCT/ISA/210) issued Apr. 19, 2022 from the International Searching Authority in International Application No. PCT/KR2022/000342.
Communication issued on May 29, 2025 from the Korean Intellectual Property Office in Korean Patent Application No. 10-2021-0018498.

* cited by examiner

FIG. 6

ELECTRONIC DEVICE COMPRISING HEAT DISSIPATION STRUCTURE

CROSS-REFERENCE TO RELATED APPLICATIONS

This application is a Continuation Application of International Application PCT/KR2022/000342 filed on Jan. 10, 2022, which claims benefit of Korean Patent Application No. 10-2021-0018498, filed on Feb. 9, 2021, at the Korean Intellectual Property Office, the disclosures of which are incorporated herein in their entireties by reference.

BACKGROUND

1. Field

Various embodiments of the disclosure relate to an electronic device including a heat dissipation structure.

2. Description of Related Art

While electronic devices are gradually becoming smaller, functions thereof are gradually being diversified. As electronic devices are becoming smaller and slimmer, electric elements embedded in the electronic device may be arranged such that a distance from a surrounding structure gradually narrows or the electric elements are concentrated. High-temperature heat may be generated due to the execution of various functions of the electronic devices. Such high-temperature heat may cause malfunction of the electronic devices and may cause discomfort to a user. Accordingly, the electronic devices may need a heat dissipation structure capable of effectively dissipating heat generated from the electrical elements to the surroundings.

SUMMARY

An electronic device may include at least one board (e.g., a printed circuit board (PCB) or flexible printed circuit board (FPCB)) disposed in an inner space and at least one electric element (e.g., an application processor (AP) as a heating element disposed on the board. The at least one electrical element may generate heat during operation, and the generated heat may be diffused to the surroundings through a heat dissipation structure disposed in the inner space of the electronic device. For example, heat generated from the at least one electric element may diffuse through a metal housing (e.g., a conductive lateral member or a metal bracket) of the electronic device. However, since the metal housing is preferentially designed based on efficient arrangement and rigidity reinforcement of electronic components, it may be difficult to expect efficient heat dissipation.

To solve this problem, the electronic device may further include at least one heat dissipation member disposed between the at least one electric element and the metal housing. A material having excellent thermal conductivity, such as a graphite sheet, a heat pipe, or a vapor chamber, may be used as the heat dissipation member.

However, a structure in which a separate heat dissipation member is added may cause a design constraint of other electronic components and may increase the volume (e.g., the thickness) of the electronic device. In addition, since it is necessary to consider a space for arranging peripheral electronic components, a space for arranging the heat dissipation member may be reduced, and heat dissipation performance may deteriorate.

Various embodiments of the disclosure may provide an electronic device including a heat dissipation structure.

Various embodiments may provide an electronic device including a heat dissipation structure capable of helping slim down the electronic device while executing an efficient heat dissipation operation.

According to various embodiment, an electronic device may include a housing, a support member disposed in an inner space of the housing and including a first surface facing a first direction and a second surface facing a second direction opposite to the first direction, at least one pattern provided in at least a portion of the first surface and/or the second surface of the support member to have a length in a predetermined direction, and a heat dissipation coating layer laminated on the first surface and/or the second surface on which the at least one pattern is provided. The at least one pattern may include multiple recesses spaced apart from each other by a predetermined interval and provided in the first surface and/or the second surface.

In an electronic device according to exemplary embodiments of the disclosure, multiple recesses are provided in the outer surface of the metal support member disposed in the inner space in a predetermined direction and are arranged at predetermined interval, and a heat dissipation coating layer is laminated on the outer surface. Thus, an effective heat dissipation action may be executed through the expansion of a heat dissipation area, and a decrease in rigidity of the support member may be suppressed through an appropriate arrangement structure of multiple recesses.

Various other effects identified directly or indirectly through this disclosure may be provided.

BRIEF DESCRIPTION OF DRAWINGS

In connection with the description of the drawings, the same or similar components may be denoted by the same or similar reference numerals.

FIG. 6 is a partial cross-sectional view of the lateral member according to various embodiments of the disclosure taken along line 6-6 of FIG. 4A.

DETAILED DESCRIPTION

Figure 1:
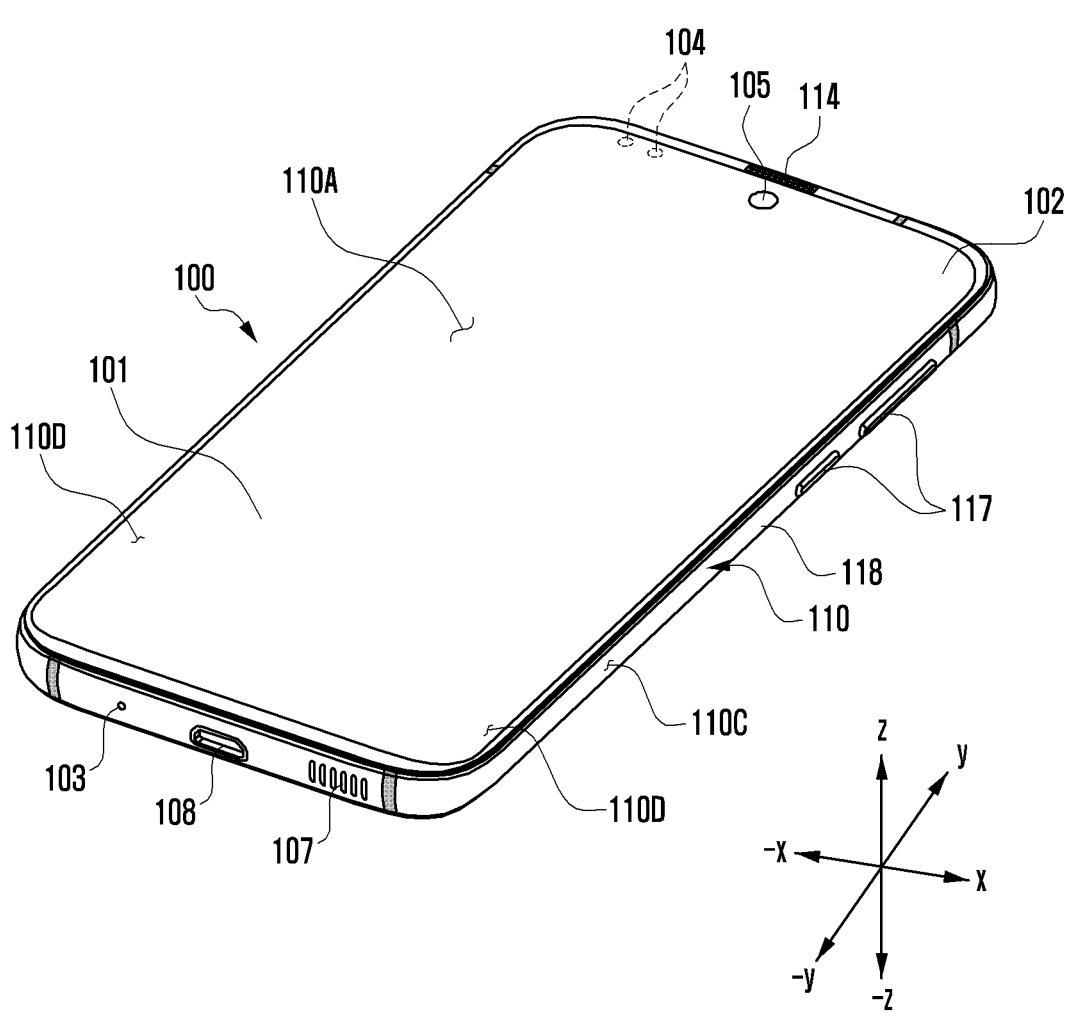
FIG. 1 is a front perspective view illustrating an electronic device (e.g., a mobile electronic device) according to various embodiments of the disclosure.
Figure 2:
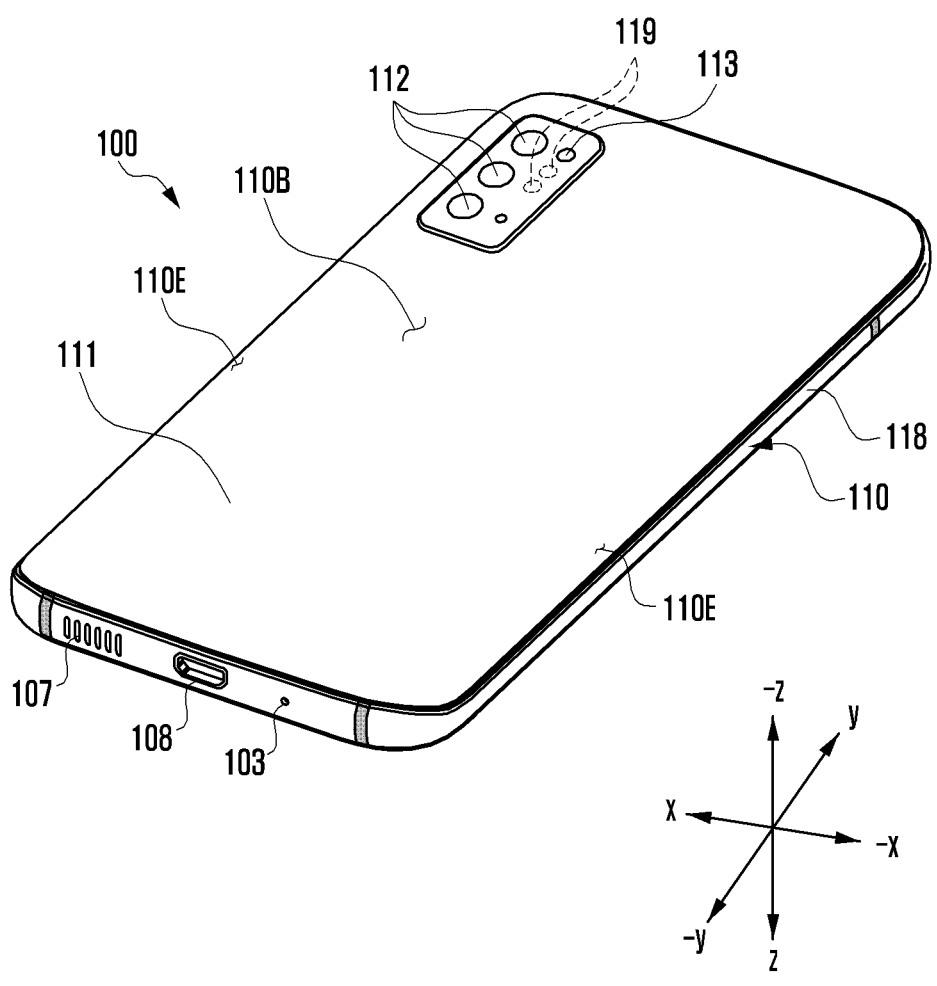
FIG. 2 is a rear perspective view illustrating a rear surface of the electronic device of FIG. 1 according to various embodiments of the disclosure.

FIG. 1 is a perspective view illustrating a front surface of a mobile electronic device according to various embodiments, and FIG. 2 is a rear a perspective view illustrating a rear surface of the mobile electronic device shown in FIG. 1 according to various embodiments.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector hole 108. The mobile electronic device 100 may omit at least one (e.g., the key input device 117 or the light emitting device) of the above components, or may further include other components. Expressions such as "at least one of a, b, and c" should be understood as including only a, only b, only c, both a and b, both a and c, both b and c, all of a, b, and c, or other variations of thereof.

The display 101 may be exposed through a substantial portion of the front plate 102, for example. At least a part of the display 101 may be exposed through the front plate 102 that forms the first surface 110A and the first region 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector hole 108 may include a first connector hole 108 adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules 105 of camera modules 105 and 112, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. According to an embodiment, an area corresponding to some camera module 105 of the display 101 is a part of an area in which content is displayed, and may be formed as a transmission area having designated transmittance. For example, the transmission area may be formed to have transmittance having a range of about 5% to about 20%. The transmission area may include an area overlapped with a valid area (e.g., a field of view (FOV)) of the camera module 105 through which light imaged by an image sensor and for generating an image passes. For example, a transmission area of the display 101 may include an area in which the density of pixels and/or a wiring density are lower than that of surroundings. The camera module 305 may include, for example, under display camera (UDC). In an embodiment, some sensor modules 104 may be arranged to perform their functions without being visually exposed through the front plate 102 in the internal space of the electronic device. For example, in this case, an area of the display 101 facing the sensor module may not require a perforated opening.

According to various embodiments, an electronic device 100 has a bar-type or plate-type appearance, but the disclosure is not limited thereto. For example, the illustrated electronic device 100 may be a part of a foldable electronic device, a slidable electronic device, a stretchable electronic device, and/or a rollable electronic device. The "foldable electronic device", the "slidable electronic device", the "stretchable electronic device", and/or the "rollable electronic device" may be an electronic device at least a part of which is folded thanks to a bendable display (e.g., the display 330 in FIG. 3) may refer, for example, to an electronic device in which the display (e.g., the display 330 in FIG. 3) is bendable and thus at least partially folded, an electronic device in which at least a portion of the display is wound or rolled, an electronic device in which a region of the display is at least partially expandable, and/or an electronic device in which the display is capable of being received in the inside of a housing (e.g., the housing (e.g., the housing 110 in FIGS. 1 and 2). In the case of the foldable electronic device, the slidable electronic device, the stretchable electronic device, and/or the rollable electronic device, a user may use a screen display region in an expanded state by unfolding the display or exposing a greater area of the display to the outside if necessary.

Figure 3:
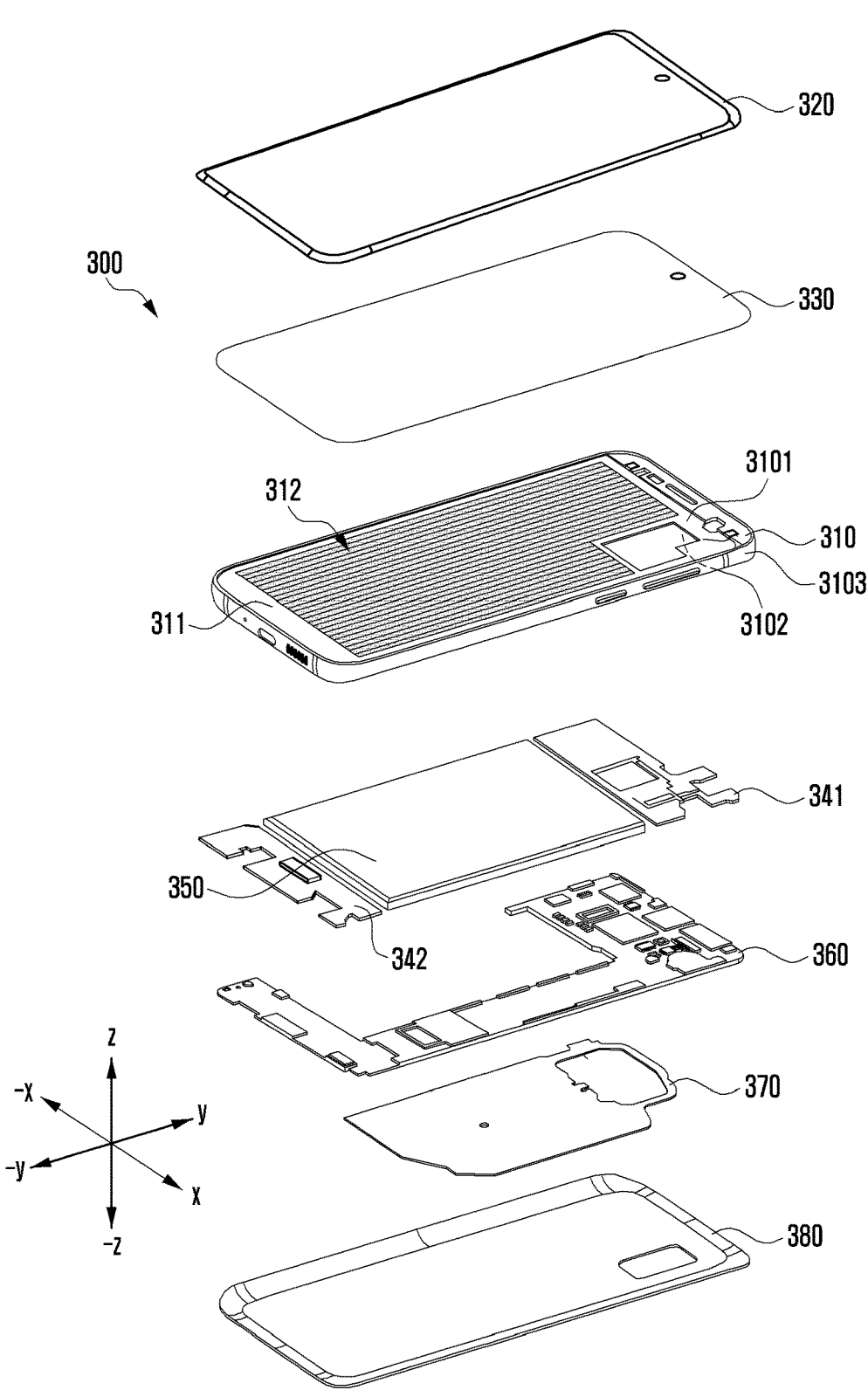
FIG. 3 is an exploded perspective view illustrating the electronic device of FIG. 1 according to various embodiments of the disclosure.

FIG. 3 is an exploded perspective view of the electronic device 100 of FIG. 1 according to various embodiments of the disclosure.

The electronic device 300 of FIG. 3 may include another embodiment of an electronic device that is at least partially similar to or different from the electronic device 100 of FIGS. 1 and 2.

Referring to FIG. 3, the electronic device 300 (e.g., the electronic device 100 in FIG. 1 or FIG. 2) may include a lateral member 310 (e.g., a side surface bezel structure), a support member 311 (e.g., a bracket or a support structure), a front surface plate 320 (e.g., the front cover in FIG. 1), a display 330 (e.g., the display 101 in FIG. 1), one or more boards, including a first board 341 and a second board 342 (e.g., a printed circuit board (PCB), a flexible PCB (FPCB), or a rigid-flex PCB (R-FPCB)), a battery 350, an additional support member 360 (e.g., a rear case), an antenna 370, and a rear surface plate 380 (e.g., the rear cover). In some embodiments, in the electronic device 300, at least one of the components (e.g., the support member 311 or the additional support member 360) may be omitted, or other components may be additionally included. At least one of the components of the electronic device 300 may be the same as or similar to at least one of the components of the electronic device 100 of FIG. 1 or FIG. 2, and a redundant description may be omitted below.

According to various embodiments, the lateral member 310 may include a first surface 3101 facing a first direction (e.g., the z-axis direction), a second surface 3102 facing a direction opposite to the first surface 3101, and a side surface 3103 surrounding the space between the first surface 3101 and the second surface 3102. According to an embodiment, at least a portion of the side surface 3103 may define an exterior of the electronic device. According to an embodiment, the support member 311 may be disposed to extend from the lateral member 310 toward the inner space (e.g., the inner space 3001 of FIG. 6) of the electronic device 300. In some embodiments, the support member 311 may be disposed separately from the lateral member 310. According to an embodiment, the lateral member 310 and/or the support member 311 may be made of, for example, a metal material and/or a non-metal material (e.g., polymer). According to an embodiment, the support member 311 may support at least a portion of the display 330 via the first surface 3101, and may be disposed to support at least a portion of the one or more boards, including a first board 341 and a second board 342 and/or a battery 350 via the second surface 3102. According to an embodiment, the one or more boards, including first board 341 and second board 342, may include a first board 341 (e.g., a main board) disposed at one side in the inner space 3001 of the electronic device 300 with respect to the battery 350 and a second board 342 (e.g., a sub-board) disposed on at the other side. According to an embodiment, the first board 341 and/or the second board 342 may include a processor, a memory, and/or an interface. According to an embodiment, the processor may include one or more of, for example, a central processor, an application processor, a graphics processor, an image signal processor, a sensor hub processor, or a communication processor. According to an embodiment, the memory may include, for example, a volatile memory or a nonvolatile memory. According to an embodiment, the interface may include, for example, a high-definition multimedia interface (HDMI), a universal serial bus (USB) interface, an SD card interface, and/or an audio interface. The interface may electrically or physically connect, for example, the electronic device 300 to an external electronic device and may include a USB connector, an SD card/an MMC connector, or an audio connector. According to an embodiment, the battery 350 is a device for supplying power to at least one component of the electronic device 300 and may include, for example, a non-rechargeable primary battery, a rechargeable secondary battery, or a fuel cell. At least a portion of the battery 350 may be disposed on substantially the same plane as, for example, the one or more boards, including first board 341 and second board 342. According to an embodiment, the battery 350 may be disposed in a manner of being embedded in the electronic device 300. In some embodiments, the battery 350 may be disposed to be detachable from the electronic device 300.

According to an embodiment, the antenna 370 may be disposed between the rear surface plate 380 and the display 330. The antenna 370 may include, for example, a near-field communication (NFC) antenna, a wireless charging antenna, and/or a magnetic secure transmission (MST) antenna. For example, the antenna 370 may perform short-range communication with an external device or may transmit/receive power required for charging to/from an external device in a wireless manner. In some embodiments, an antenna structure may be configured by a portion of the lateral member 310, and/or a portion of the support member 311, or a combination thereof. In some embodiments, the electronic device 300 may further include a digitizer configured to detect an external electronic pen.

According to various embodiments, the electronic device 300 may include at least one electric device (e.g., the electric element 3411 of FIG. 6) disposed on the first board 341 and/or the second board 342. According to an embodiment, the electronic device 300 may include a first heat dissipation coating layer 410 disposed in at least a partial area of the support member 311 extending from the lateral member 310. According to an embodiment, the first heat dissipation coating layer 410 may be disposed through the first pattern 312 provided on the first surface 3101 of the support member 311. According to an embodiment, the first pattern 312 may include multiple first recesses (the multiple first recesses 3121 of FIG. 4A) provided in the first surface 3101 of the support member 311 to be lower than the first surface 3101 and arranged at predetermined intervals. According to an embodiment, the first heat dissipation coating layer 410 may be arranged to include the multiple first recesses (the multiple first recesses 3121 in FIG. 4A) in the first surface 3101, thereby expanding the heat dissipation area. Therefore, the heat generated from at least one electric element (e.g., the electric element 3411 of FIG. 6) may be quickly diffused to the entire area of the support member 311 made of a metal material through the first heat dissipation coating layer 410 of which the heat dissipation area is expanded by the multiple first recesses (the multiple first recesses 3121 of FIG. 4A).

According to various embodiments, the electronic device 300 may include a second heat dissipation coating layer (e.g., the second heat dissipation coating layer 420 of FIG. 4B) disposed through a second pattern (e.g., the second pattern 313 of FIG. 4B) provided on the second surface 3102 of the support member 311. According to an embodiment, the second pattern (the second pattern 313 in FIG. 4B) may include multiple second recesses (e.g., the multiple second recesses 3131 of FIG. 4B) provided in the second surface 3102 to be lower than the second surface 3102 and arranged at predetermined intervals. According to an embodiment, the second heat dissipation coating layer (e.g., the second heat dissipation coating layer 420 of FIG. 4B) may also be disposed to include the multiple second recesses (e.g., the multiple second recesses 3131 of FIG. 4B), thereby expanding the heat dissipation area. According to an embodiment, the first heat dissipation coating layer 410 and the second heat dissipation coating layer (e.g., the second heat dissipation coating layer 420 of FIG. 4B) may be made of substantially the same material. For example, the first heat dissipation coating layer 410 and the second heat-dissipating coating layer (e.g., the second heat dissipation coating layer 420 of FIG. 4B) may include a copper plating layer containing carbon mixed in a predetermined ratio. In some embodiments, the first heat dissipation coating layer 410 and the second heat dissipation coating layer (e.g., the second heat dissipation coating layer 420 of FIG. 4B) may be made of a material having excellent thermal conductivity and disposed on the first surface 3101 and the second surface 3102 of the support member 311 through at least one process from among spraying, painting, deposition, or sputtering. In some embodiments, the first heat dissipation coating layer 410 and the second heat dissipation coating layer 420 may be made of different materials depending on the arrangement structure and/or the degree of heat generation of electric elements disposed therearound (e.g., the electric element 3411 of FIG. 6). According to an embodiment, the first pattern 312 and the second pattern (e.g., the second pattern 313 of FIG. 4B) may be configured in substantially the same shape. In some embodiments, the first pattern 312 and the second pattern (e.g., the second pattern 313 of FIG. 4B) may be configured in different shapes depending on the arrangement structure and/or the degree of heat generation of electric elements disposed therearound (e.g., the electric element 3411 of FIG. 6).

Hereinafter, the first pattern 312, the second pattern (the second pattern 313 of FIG. 4B), and the first and the second heat dissipation coating layers 410 and 420 laminated on the first pattern 312 and the second pattern (the second pattern 313 of FIG. 4B) will be described in detail.

Figure 4A:
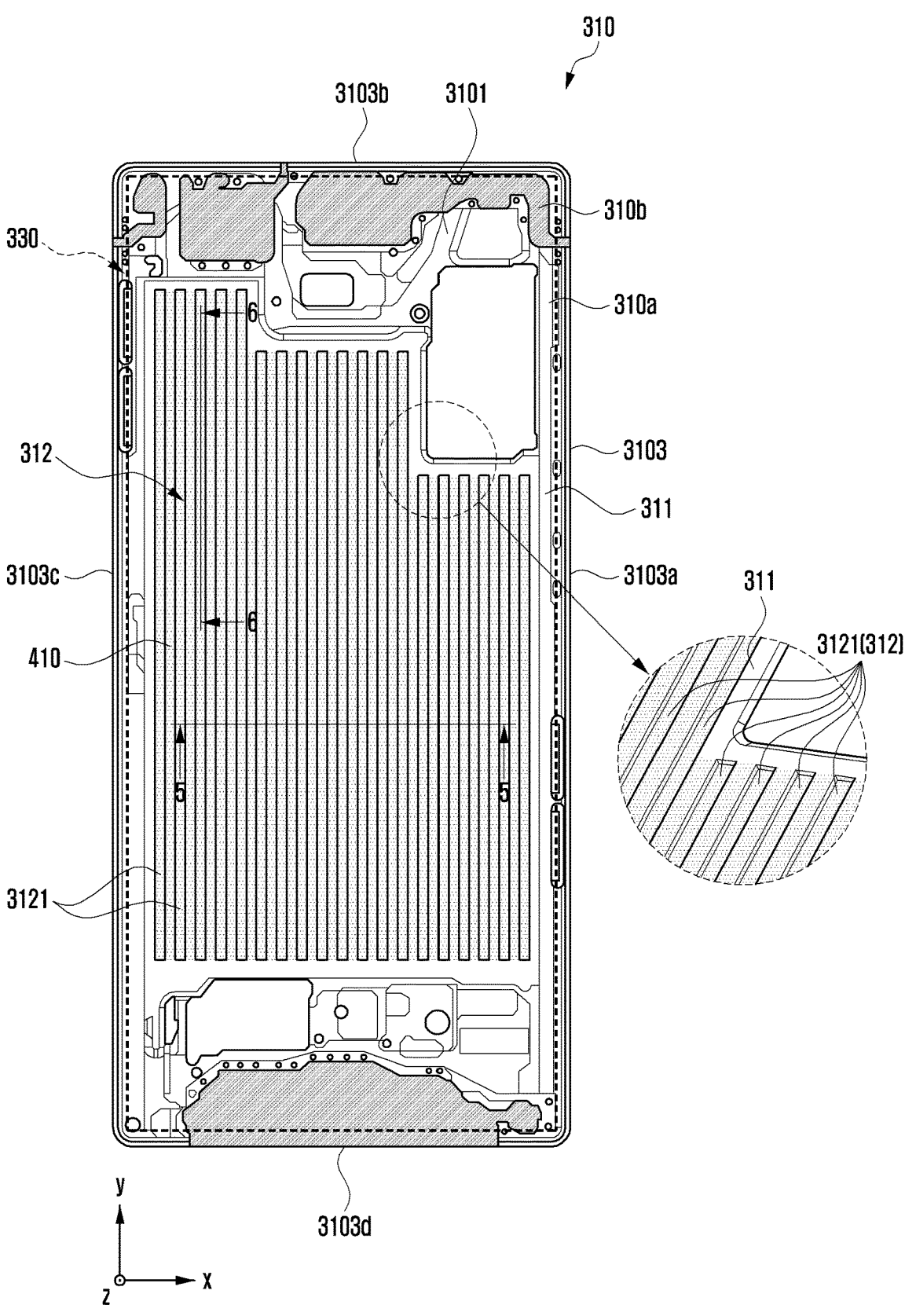
FIG. 4A is a front view of a lateral member according to various embodiments of the disclosure, showing a configuration of the same.
Figure 4B:
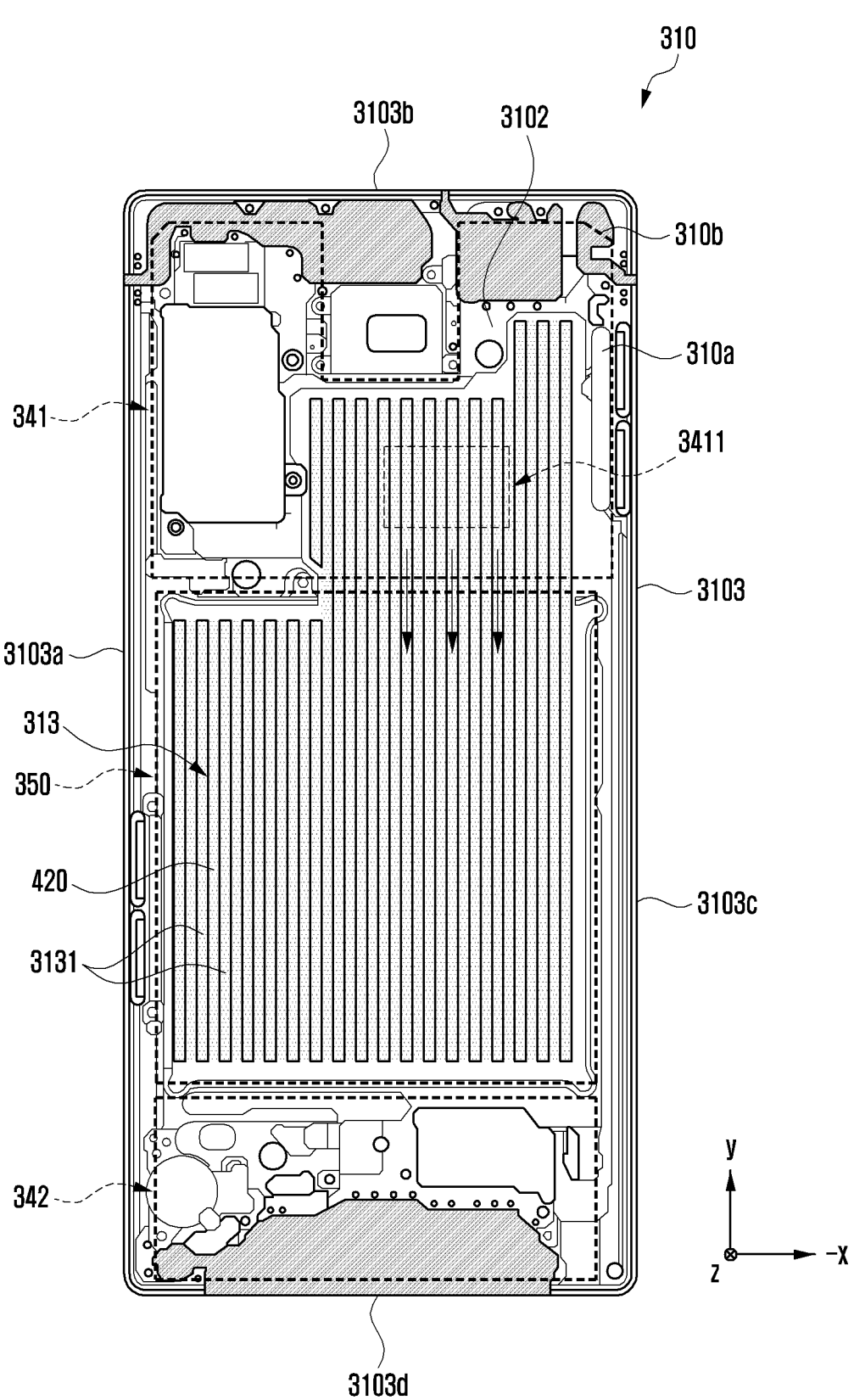
FIG. 4B is a rear view of the lateral member according to various embodiments of the disclosure, showing a configuration of the same.

FIG. 4A is a front view of a lateral member according to various embodiments of the disclosure illustrating a configuration of the same. FIG. 4B is a rear view of the lateral member according to various embodiments of the disclosure illustrating a configuration of the same.

Referring to FIGS. 4A and 4B, an electronic device (e.g., the electronic device 300 in FIG. 3) may include a lateral member 310 and a support member 311 extending to the inner space (e.g., the inner space 3001 in FIG. 6) of the electronic device (e.g., the electronic device 300 in FIG. 3) from the lateral member 310. According to an embodiment, the lateral member 310 may include a conductive portion 310a (e.g., a metal material) and a non-conductive portion 310b (e.g., a polymer) coupled to the conductive portion 310a. According to an embodiment, the conductive portion 310a may be arranged to have excellent rigidity based on an efficient arrangement design of electronic components disposed in the inner space (e.g., the inner space 3001 of FIG. 6) of the electronic device (e.g., the electronic device 300 of FIG. 3).

According to various embodiments, the lateral member 310 may include a first surface 3101 facing a predetermined direction (e.g., the z-axis direction), a second surface 3102 facing a direction (e.g., the −z-axis direction) opposite to the first surface 3101, and a side surface 3103 surrounding the space between the first surface 3101 and the second surface 3102. According to an embodiment, the side surface 3103 may include a first side surface 3103a having a first length in a predetermined direction (e.g., the y-axis direction), a second side surface 3103b extending from the first side surface 3103a to a direction (e.g., the −x-axis direction) perpendicular to the first side surface 3103a and having a second length smaller than the first length, a third side surface 3103c extending from the second side surface 3103b to be parallel to the first side surface 3103a and having the first length, and a fourth side surface 3103d extending from the third side surface 3103c to be parallel to the second side surface 3103b, connected to the first side surface 3103a, and having the second length. Accordingly, the electronic device (e.g., the electronic device 300 of FIG. 3) may have a length in a direction (e.g., the y-axis direction) parallel to the first side surface 3103a and the third side surface 3103c of the lateral member 310. According to an embodiment, the display 330 may be arranged to be supported by at least a portion of the first surface 3101 of the lateral member 310 in the inner space (e.g., the inner space 3001 of FIG. 6) of the electronic device (e.g., the electronic device 300 of FIG. 3) and to be visible from the outside through the front cover (e.g., the front surface plate 320 of FIG. 3). According to an embodiment, the first board 341 including at least one electric element 3411 and the battery 350 may be arranged between the second surface 3102 and the rear cover (e.g., the rear surface plate 380 of FIG. 3) to be supported by the second surface 3102.

According to various embodiments, the lateral member 310 may include a first pattern 312 including multiple first recesses 3121 provided in the first surface 3101. According to an embodiment, the multiple first recesses 3121 may have a predetermined depth to be lower than the first surface 3101 and may be arranged at predetermined intervals. According to an embodiment, each of the multiple first recesses 3121 may have a predetermined width. In some embodiments, the intervals of the multiple first recesses 3121 may be substantially the same as or different from each other. In some embodiments, the multiple first recesses 3121 may each have substantially the same width or may have different widths. According to an embodiment, the multiple first recesses 3121 may be provided to have a length along the length direction of the electronic device (e.g., the electronic device 300 of FIG. 3) (e.g., the y-axis direction), thereby helping reinforce rigidity to prevent bending or breakage of the electronic device (e.g., the electronic device 300 of FIG. 3) due to shear stress applied in a direction (e.g., ±z-axis direction) perpendicular to the length direction. According to an embodiment, the multiple first recesses 3121 may be provided through at least one of mold patterning, laser processing, and etching. According to an embodiment, the first pattern 312 may be provided over substantially the entire area of the first surface 3101 of the lateral member 310. In some embodiments, the first pattern 312 may be provided in a conductive portion 31*a* of the lateral member 310. In some embodiments, the first pattern 312 may be provided not only in the conductive portion 310*a* but also in at least a portion of the non-conductive portion 310*b*. According to an embodiment, the lateral member 310 may include a first heat dissipation coating layer 410 laminated (coated) on the first surface 3101. According to an embodiment, the first heat dissipation coating layer 410 may include a copper plating layer containing carbon mixed in a predetermined ratio. According to an embodiment, the first heat dissipation coating layer 410 may be laminated on at least a portion of the first surface 3101 where the first pattern 312 is provided. Accordingly, the first surface 3101 of the lateral member 310 may be induced to expand a heat dissipation area with the first heat dissipation coating layer 410 through the multiple first recesses 3121.

According to various embodiments, the lateral member 310 may include a second pattern 313 including multiple second recesses 3131 provided in the second surface 3102. According to an embodiment, the multiple second recesses 3131 may have a predetermined depth to be lower than the second surface 3102 and may be arranged at predetermined intervals. According to an embodiment, each of the multiple second recesses 3131 may have a predetermined width. In some embodiments, the intervals of the multiple second recesses 3131 may be substantially the same as or different from each other. In some embodiments, the multiple second recesses 3131 may each have substantially the same width or may have different widths. According to an embodiment, the multiple second recesses 3131 may also be provided to have a length along the length direction of the electronic device (e.g., the electronic device 300 of FIG. 3) (e.g., the y-axis direction), thereby helping reinforce rigidity to prevent bending or breakage of the electronic device (e.g., the electronic device 300 of FIG. 3) due to shear stress applied in a direction (e.g., the ±z-axis direction) perpendicular to the length direction. According to an embodiment, the second pattern 313 may be provided over substantially the entire area of the second surface 3102 of the lateral member 310. In some embodiments, the second pattern 313 may be provided in the conductive portion 310*a* of the lateral member 310. In some embodiments, the second pattern 313 may be provided not only in the conductive portion 310*a* but also in at least a portion of the non-conductive portion 310*b*. According to an embodiment, the lateral member 310 may include a second heat dissipation coating layer 420 laminated (coated) on the second surface 3102. According to an embodiment, the second heat dissipation coating layer 420 may be laminated on at least a portion of the second surface 3102 where the second pattern 313 is provided. Accordingly, the second surface 3102 of the lateral member 310 may be induced to expand a heat dissipation area with the second heat dissipation coating layer 420 through the multiple second recesses 3131. According to an embodiment, the second heat dissipation coating layer 420 may be disposed to at least partially overlap the electric element 3411 disposed on the first board 341 when the first surface 3101 is viewed from above.

According to various embodiments, the second pattern 313 may have substantially the same shape as the first pattern 312. In some embodiments, the second pattern 313 may have a shape different from that of the first pattern 312. According to an embodiment, the first heat dissipation coating layer 410 may be made of substantially the same material as the second heat dissipation coating layer 420. In some embodiments, the first heat dissipation coating layer 410 may be made of a material having a thermal conductivity different from that of the second heat dissipation coating layer 420.

Figure 5:
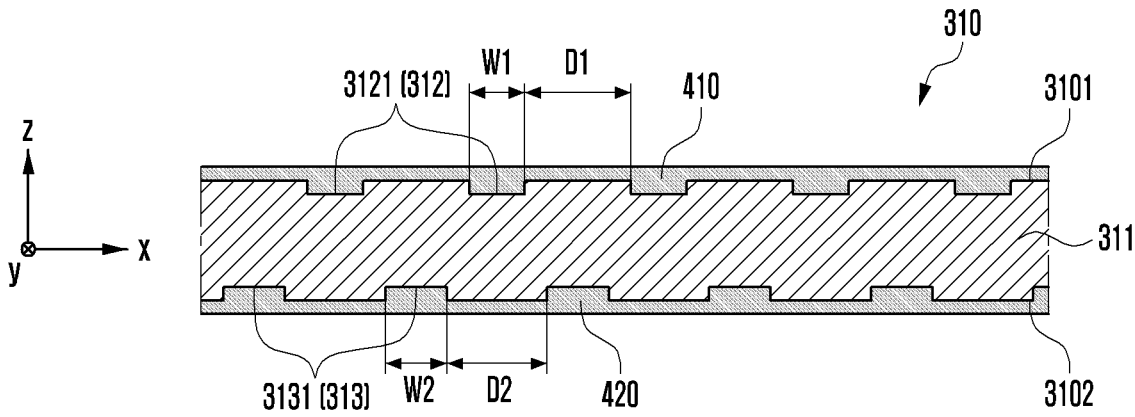
FIG. 5 is a partial cross-sectional view of the lateral member according to various embodiments of the disclosure taken along line 5-5 of FIG. 4A.

FIG. 5 is a partial cross-sectional view of the lateral member according to various embodiments of the disclosure taken along line 5-5 of FIG. 4A.

Referring to FIG. 5, the lateral member 310 may include a first pattern 312 including multiple first recesses 3121 provided in the first surface 3101 of the support member 311 and a second pattern 313 including multiple second recesses 3131 provided in the second surface 3102. According to an embodiment, the lateral member 310 may include a first heat dissipation coating layer 410 laminated on a corresponding area of the first surface 3101 in which at least the multiple first recesses 3121 of the support member 311 are included, and a second heat dissipation coating layer 420 laminated on a corresponding area of the second surface 3102 in which at least the multiple second recesses 3131 are included.

According to various embodiments, the multiple first recesses 3121 may each have a first width W1 and may have a first interval D1 from each other. According to an embodiment, the first interval D1 may be equal to or greater than the first width W1. According to an embodiment, the multiple second recesses 3131 may each have a second width W2 and may have a second interval D2 from each other. According to an embodiment, the second interval D2 may be equal to or greater than the second width W2. According to an embodiment, the first width W1 may be substantially equal to the second width W2. In some embodiments, the first width W1 may be different from the second width W2. According to an embodiment, the first interval D1 may be substantially equal to the second interval D2. In some embodiments, the first interval D1 may be different from the second interval D2. According to an embodiment, the depths of the multiple first recesses 3121 and/or the multiple second recesses 3131 may be less than or equal to about 0.2 mm. According to an embodiment, the depths of the multiple first recesses 3121 and/or the multiple second recesses 3131 may range from about 0.01 mm to about 0.2 mm. According to an embodiment, the first width W1 and/or the second width W2 may be about 0.5 mm or less. According to an embodiment, the first width W1 and/or the second width W2 may range from about 0.01 mm to about 0.5 mm. According to an embodiment, the first interval D1 and/or the second interval D2 may be about 0.5 mm or less. According to an embodiment, the first interval D1 and/or the second interval D2 may range from about 0.01 mm to about 0.5 mm.

According to various embodiments, each of the multiple first recesses 3121 may be disposed not to at least partially overlap each of the multiple second recesses 3131 when the first surface 3101 is viewed from above. This is to reduce the rigidity degradation phenomenon caused when the multiple first recesses 3121 overlap the multiple second recesses 3131 and the thickness of the support member 311 is reduced in the overlapping region. According to an embodiment, the first heat dissipation coating layer 410 and/or the second heat dissipation coating layer 420 may be laminated to be filled in the multiple first recesses 3121 and/or the multiple second recesses 3131 and then to have outer surfaces parallel to the first surface 3101 and/or the second surface 3102. According to an embodiment, the first heat dissipation coating layer 410 and/or the second heat dissipation coating layer 420 may have a thickness of about 0.2 mm or less. According to an embodiment, the first heat dissipation coating layer 410 and/or the second heat dissipation coating layer 420 may have a thickness ranging from about 0.01 to about 0.2 mm.

Figure 6:
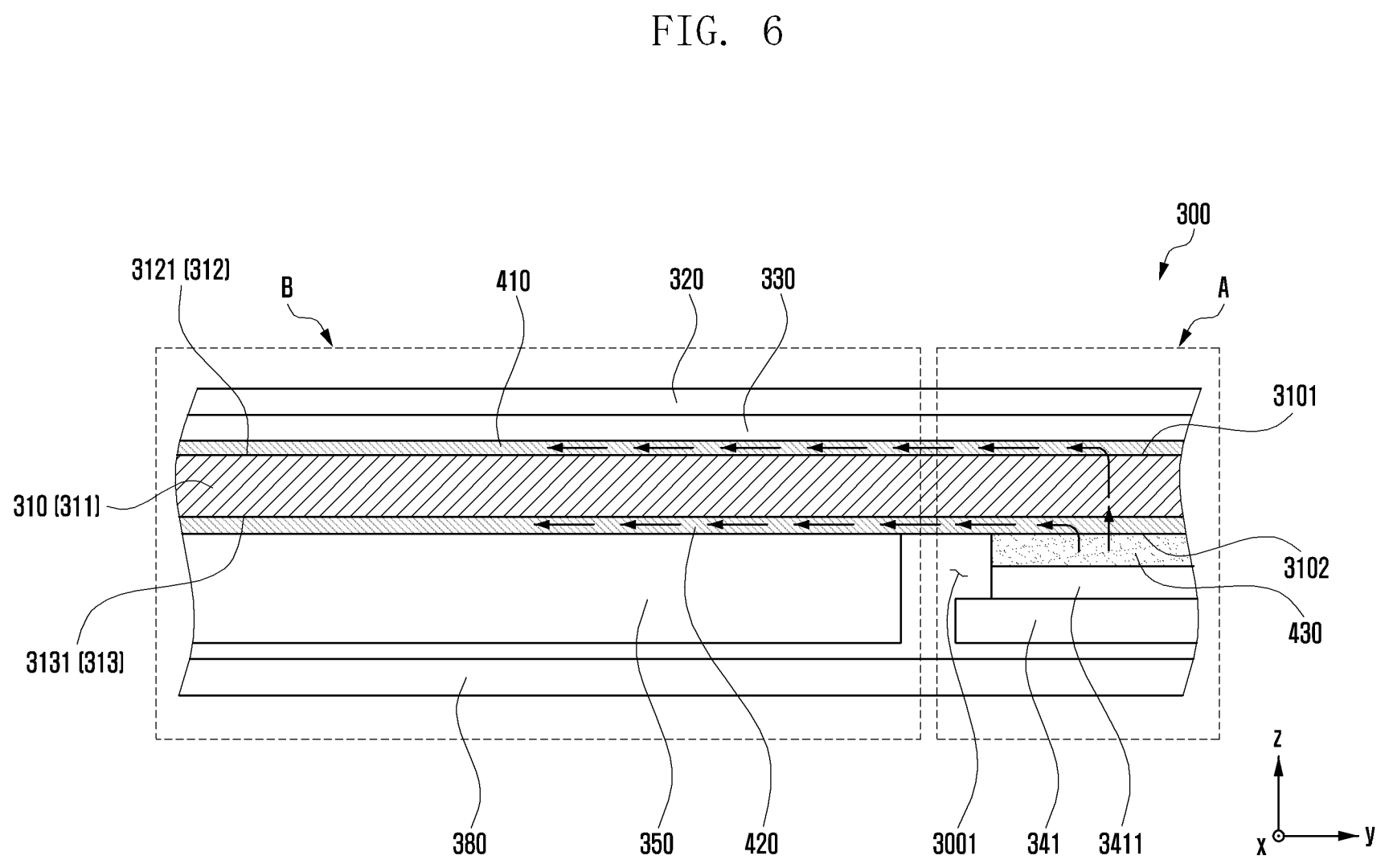

FIG. 6 is a partial cross-sectional view of the lateral member according to various embodiments of the disclosure taken along line 6-6 of FIG. 4A.

Referring to FIG. 6, the electronic device may include a lateral member 310 including a support member 311 including a first surface 3101 facing a first direction (e.g., the z-axis direction) and a second surface 3102 facing a second direction (e.g., the –z-axis direction) opposite to the first surface 3101, a front cover (e.g., the front surface plate 320 in FIG. 3) disposed to correspond to the first surface 3101, a display 330 disposed between the front cover and the first surface 3101 to be visible from the outside through the front cover, a rear cover disposed to correspond to the second surface 3102, and a first board 341 and a battery 350 which are disposed between the rear cover and the second surface 3102. According to an embodiment, the first board 341 may be disposed in a first area (area A) of the electronic device 300, and the battery 350 may be disposed in a second area (area B) different from the first area (area A).

According to various embodiments, the electronic device 300 may include a first pattern 312 including multiple first recesses 3121 provided in the first surface 3101 of the support member 311 and a second pattern 313 including multiple second recesses 3131 provided in the second surface 3102. According to an embodiment, the lateral member 310 may include a first heat dissipation coating layer 410 laminated on a corresponding area of the first surface 3101 in which at least the multiple first recesses 3121 of the support member 311 are included, and a second heat dissipation coating layer 420 laminated on a corresponding area of the second surface 3102 in which at least the multiple second recesses 3131 are included. According to an embodiment, the electronic device 300 may include an electric element 3411 (e.g., an application processor (AP)) disposed on the first board 341 and a heat transfer member 430 disposed between the electric element 3411 and the second heat dissipation coating layer 420. According to an embodiment, the heat transfer member 430 may be placed in contact with or close to the electric element 4311 and/or the second heat dissipation coating layer 420. According to an embodiment, the heat transfer member 430 may include a thermal interface material (TIM).

According to various embodiments, heat generated from the electric element 3411 when the electronic device 300 operates may be placed in a partial area (e.g., area A) of the electronic device 300 and may cause a heat accumulation phenomenon in the corresponding area without being diffused to surroundings, thereby resulting in malfunction of the electronic device 300 and providing a sense of discomfort to the user.

According to an exemplary embodiment of the disclosure, heat generated from the electric element 3411 disposed in a partial area (e.g., area A) of the electronic device 300 may be transferred to the heat transfer member 430. According to an embodiment, the heat transferred to the heat transfer member 430 may be quickly diffused to the surrounding area (e.g., area B) by the second heat dissipation coating layer 420 provided to have an expanded heat dissipation area through the multiple second recesses 3131, the conductive portion (e.g., the conductive portion 310a in FIG. 4A) of the support member 311, and the first heat dissipation coating layer 410 provided in substantially the same manner as the second heat dissipation coating layer 420. In some embodiments, the electric element 3411 may be disposed between the front cover and the first surface 3101 in the inner space 3001 of the electronic device 300.

FIGS. 7A to 7D are partial cross-sectional views of lateral members including recesses having various shapes according to various embodiments of the disclosure.

In describing the lateral members 310 of FIGS. 7A to 7D, the same reference numerals are assigned to components that are substantially the same as those of the lateral member 310 of FIGS. 4A to 5, and a detailed description thereof may be omitted.

Figure 7A:
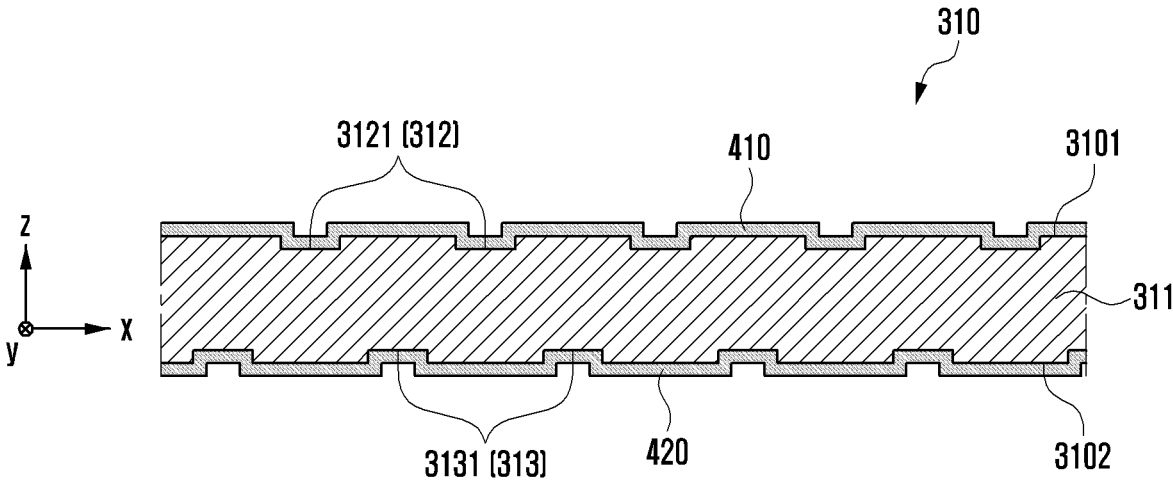
FIGS. 7A to 7D are partial cross-sectional views of lateral members including recesses having various shapes according to various embodiments of the disclosure.

Referring to FIG. 7A, the lateral member 310 may include a first pattern 312 including multiple first recesses 3121 provided in the first surface 3101 of the support member 311 and a second pattern 313 including multiple second recesses 3131 provided in the second surface 3102 of the support member 311. According to an embodiment, the lateral member 310 may include a first heat dissipation coating layer 410 laminated on a corresponding area of the first surface 3101 in which at least the multiple first recesses 3121 of the support member 311 are included, and a second heat dissipation coating layer 420 laminated on a corresponding area of the second surface 3102 in which at least the multiple second recesses 3131 are included. According to an embodiment, the first heat dissipation coating layer 410 and/or the second heat dissipation coating layer 420 may be laminated to correspond to the shape of the multiple first recesses 3121 and/or the multiple second recesses 3131. Accordingly, the outer surface of the first heat dissipation coating layer 410 and/or the second heat dissipation coating layer 420 may have a shape corresponding to the first surface 3101 and/or the second surface 3102 alternately bent by the multiple first recesses 3121 and/or the multiple second recesses 3131.

Figure 7B:
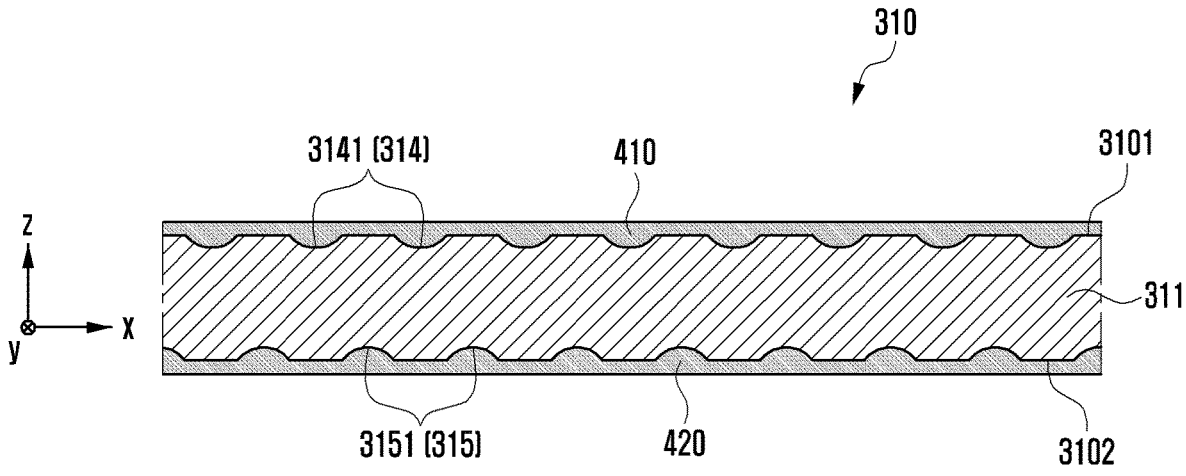

Referring to FIG. 7B, the lateral member 310 may include a first pattern 314 including multiple first recesses 3141 provided in the first surface 3101 of the support member 311
and a second pattern 315 including multiple second recesses
3151 provided in the second surface 3102 of the support
member 311. According to an embodiment, the multiple first
recesses 3141 and the multiple second recesses 3151 may
have a curved shape having a predetermined curvature.
According to an embodiment, the first heat dissipation
coating layer 410 and/or the second heat dissipation coating
layer 420 may be laminated to be filled in the multiple first
recesses 3141 and/or the multiple second recesses 3151 and
then to have outer surfaces parallel to the first surface 3101
and/or the second surface 3102.

Figure 7C:
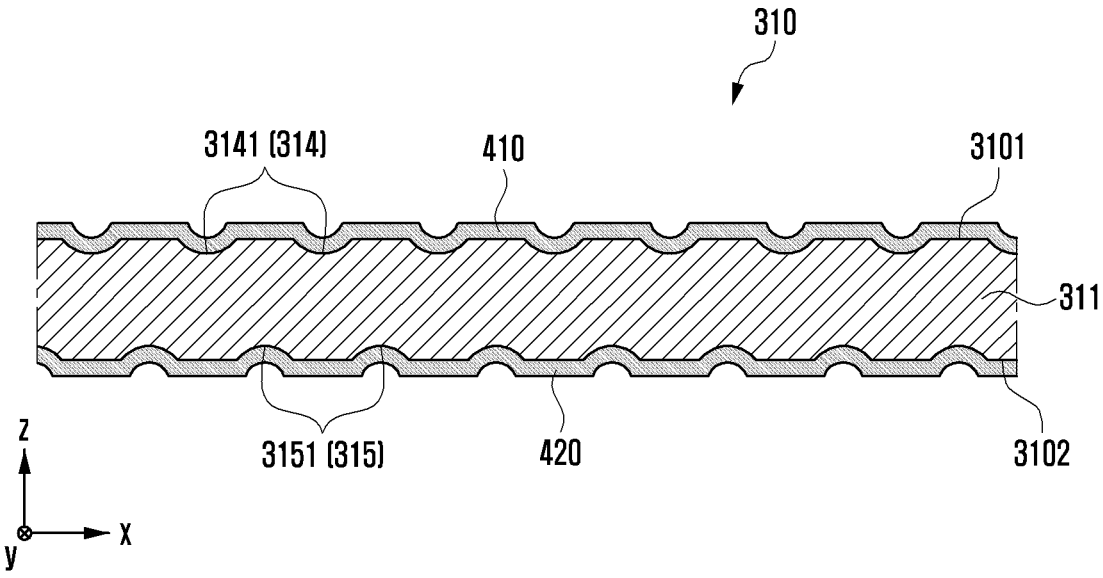

Referring to FIG. 7C, in the lateral member 310 in FIG.
7B, the first heat dissipation coating layer 410 and/or the
second heat dissipation coating layer 420 may be laminated
to correspond to the shape of the multiple first recesses 3141
and/or the multiple second recesses 3151. Accordingly, the
outer surface of the first heat dissipation coating layer 410
and/or the second heat dissipation coating layer 420 may
have a shape corresponding to the first surface 3101 and/or
the second surface 3102 alternately bent by the multiple first
recesses 3141 and/or the multiple second recesses 3151.

Figure 7D:
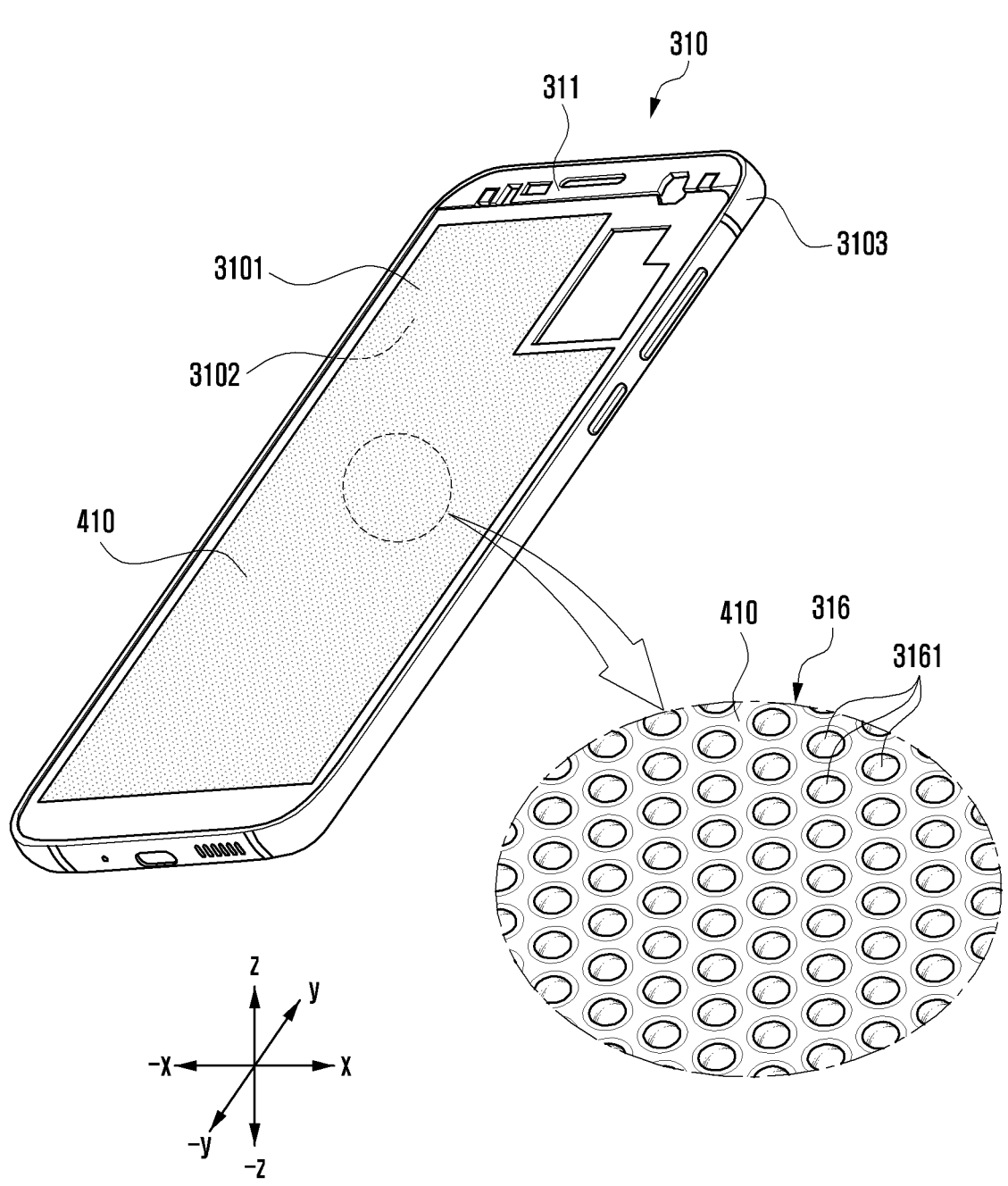

Referring to FIG. 7D, the lateral member 310 may include
a protrusion pattern 316 including multiple protrusions 3161
provided on the first surface 3101 of the support member 311
at predetermined intervals to be higher than the first surface
3101, and a first heat dissipation coating layer 410 laminated
on the first surface 3101. According to an embodiment, the
lateral member 310 may have an expanded heat dissipation
area with the multiple protrusions 3161 protruding from the
first surface 3101. According to an embodiment, the multiple
protrusions 3161 may include circular embossed protrusions
protruding from the first surface 3101 to have a predeter-
mined radius and curvature. In some embodiments, the
multiple protrusions 3161 may protrude from the first sur-
face 3101 to have various non-circular shapes such as a
rectangular shape or an oval shape. In some embodiments,
the first heat dissipation coating layer 410 may be laminated
to have a sufficient thickness such that the outer surface
thereof is flat and parallel to the first surface 3101. In some
embodiments, the first heat dissipation coating layer 410
may be laminated to a predetermined thickness correspond-
ing to the shape of the multiple protrusions 3161. In some
embodiments, the lateral member 310 may further include
multiple protrusions and a heat dissipation coating layer
provided on the second surface 3102 in substantially the
same manner as the multiple protrusions and the heat
dissipation coating layer.

FIGS. 8A to 8D are views illustrating configurations of
lateral members including various types of patterns accord-
ing to various embodiments of the disclosure.

In describing the lateral members 310 of FIGS. 8A to 8D,
the same reference numerals are assigned to components
that are substantially the same as those of the lateral member
310 of FIG. 4A, and a detailed description thereof may be
omitted.

FIGS. 8A to 8D illustrate patterns 810, 820, 830, 840, 850,
and 860 provided on a first surface 3101 of a support
member 311 of a lateral member 310 and a heat dissipation
coating layer 410 applied thereto. However, it is obvious that
the patterns 810, 820, 830, 840, 850, and 860 and the first
heat dissipation coating layer 410 may be applied to a
second surface 3102 in substantially the same manner as in
the first surface.

Figure 8A:
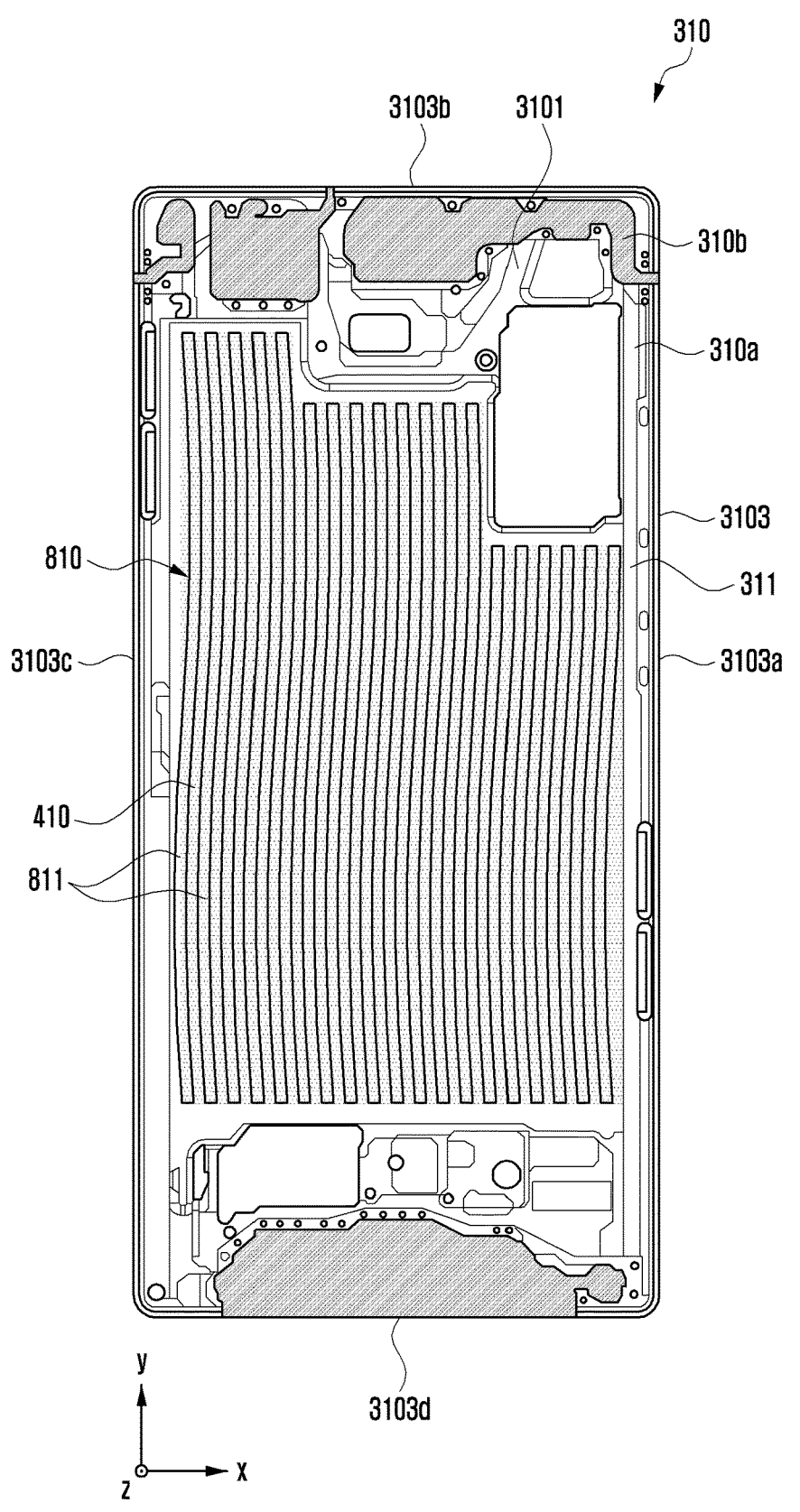
FIGS. 8A to 8D are views illustrating configurations of lateral members including various types of patterns according to various embodiments of the disclosure.

Referring to FIG. 8A, the lateral member 310 may include
a pattern 810 including multiple recesses 811 provided on a
first surface 3101 of a support member 311 and a first heat dissipation coating layer 410 laminated on the first surface
3101. According to an embodiment, the multiple recesses
811 may be provided to have a predetermined depth, width,
or interval and to be lower than the first surface 3101.
According to an embodiment, the multiple recesses 811 may
be provided to have a length along the length direction of the
lateral member 310 (e.g., the y-axis direction). According to
an embodiment, the multiple recesses 811 may be provided
in a curved shape (a non-linear shape) rather than a straight
line shape (a linear shape).

Figure 8B:
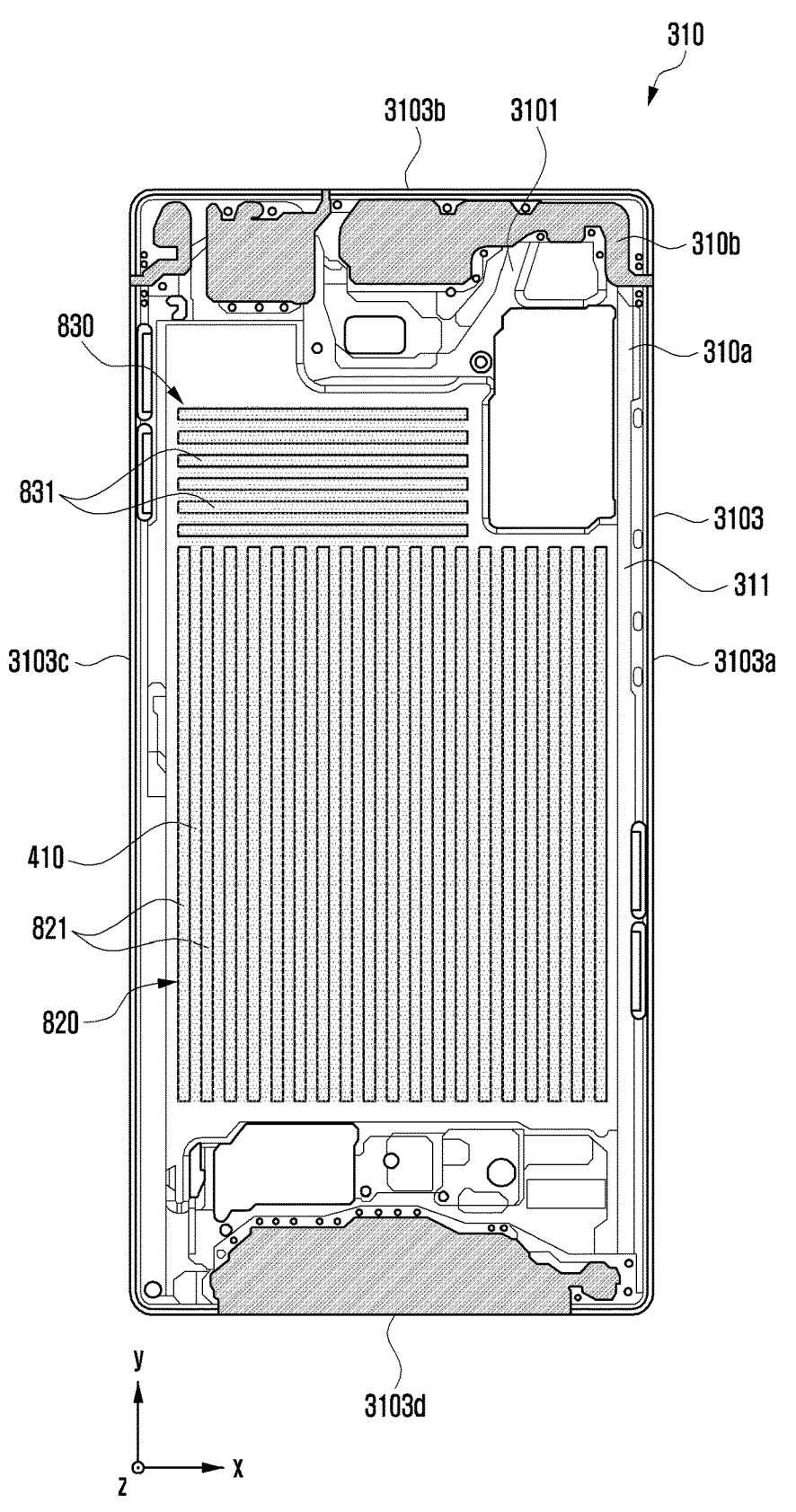

Referring to FIG. 8B, the lateral member 310 may include
a first pattern 820 including multiple first recesses 821
provided in a first area of the first surface 3101 of the support
member 311 and a second pattern 830 including multiple
second recesses 831 provided in a second area different from
the first area. According to an embodiment, the lateral
member 310 may include a first heat dissipation coating
layer 410 laminated on the first surface 3101 to include at
least the first pattern 820 and the second pattern 830.
According to an embodiment, the multiple first recesses 821
may be provided along a first direction (e.g., the y-axis
direction). According to an embodiment, the multiple second
recesses 831 may be provided along a second direction (the
x-axis direction) different from the first direction. For
example, the second direction may include various direc-
tions not parallel to the first direction.

Figure 8C:
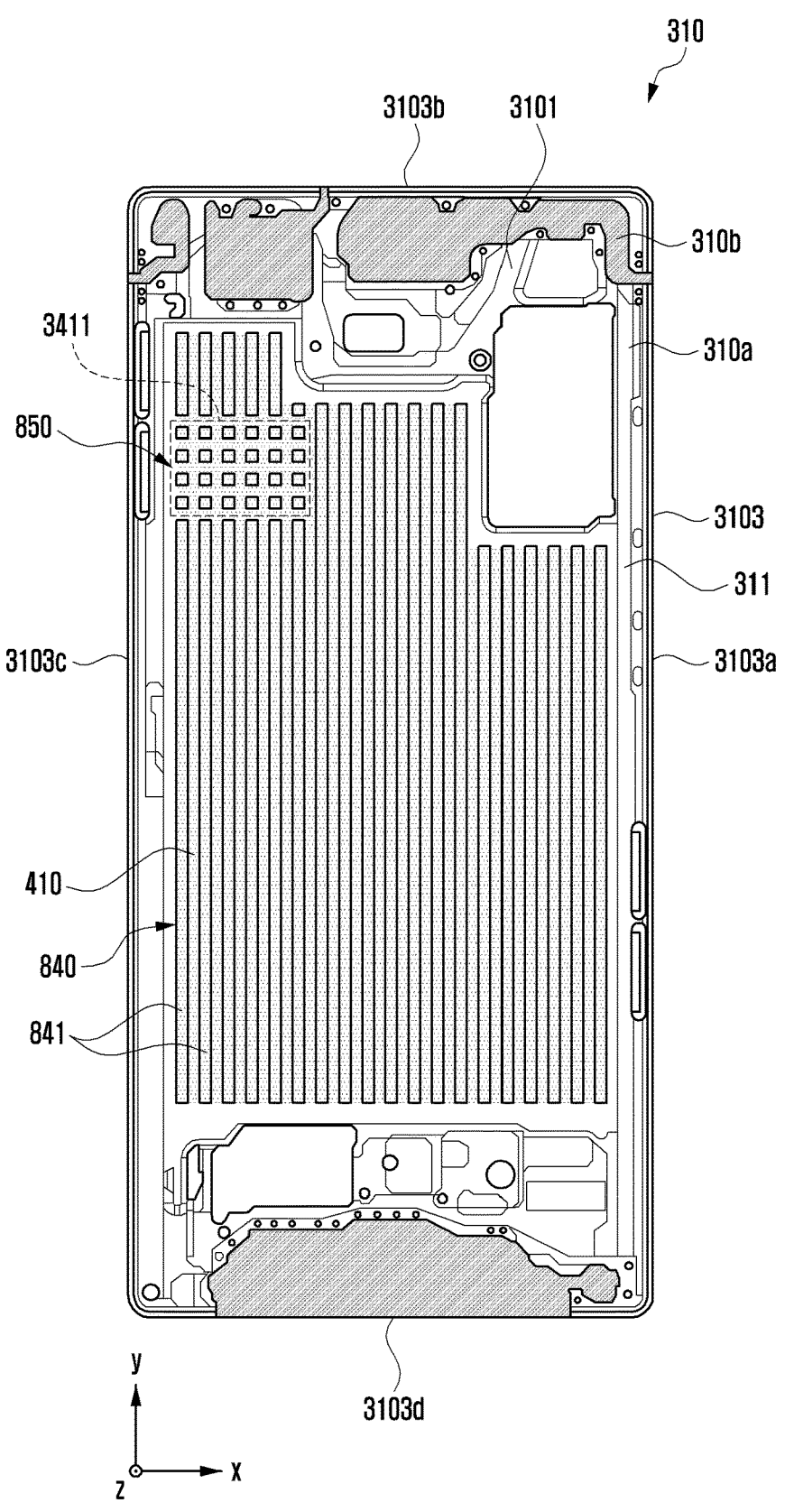

Referring to FIG. 8C, the lateral member 310 may include
a first pattern 840 including multiple first recesses 841
provided in a first area of the first surface 3101 of the support
member 311 and a cross pattern 850 provided in a second
area different from the first area. For example, the cross
pattern 850 may be provided by arranging the multiple first
recesses 821 and the multiple second recesses 831 of FIG.
8B to cross each other. According to an embodiment, the
lateral member 310 may include a first heat dissipation
coating layer 410 laminated on the first surface 3101 to
include at least the first pattern 840 and the cross pattern 850.
According to an embodiment, in the first area where the
cross pattern 850 is provided, a heat dissipation area with the
first heat dissipation coating layer 410 may be greater than
the surrounding area. According to an embodiment, the area
where the cross pattern 850 is provided may be disposed in
an area at least partially overlapping the electric element
3411 when the first surface 3101 is viewed from above.
Thus, heat generated from the electric element 3411 may be
rapidly guided to the first heat dissipation coating layer 410
and the conductive portion 310a of the support member 311
and may then be diffused to the surrounding area.

Figure 8D:
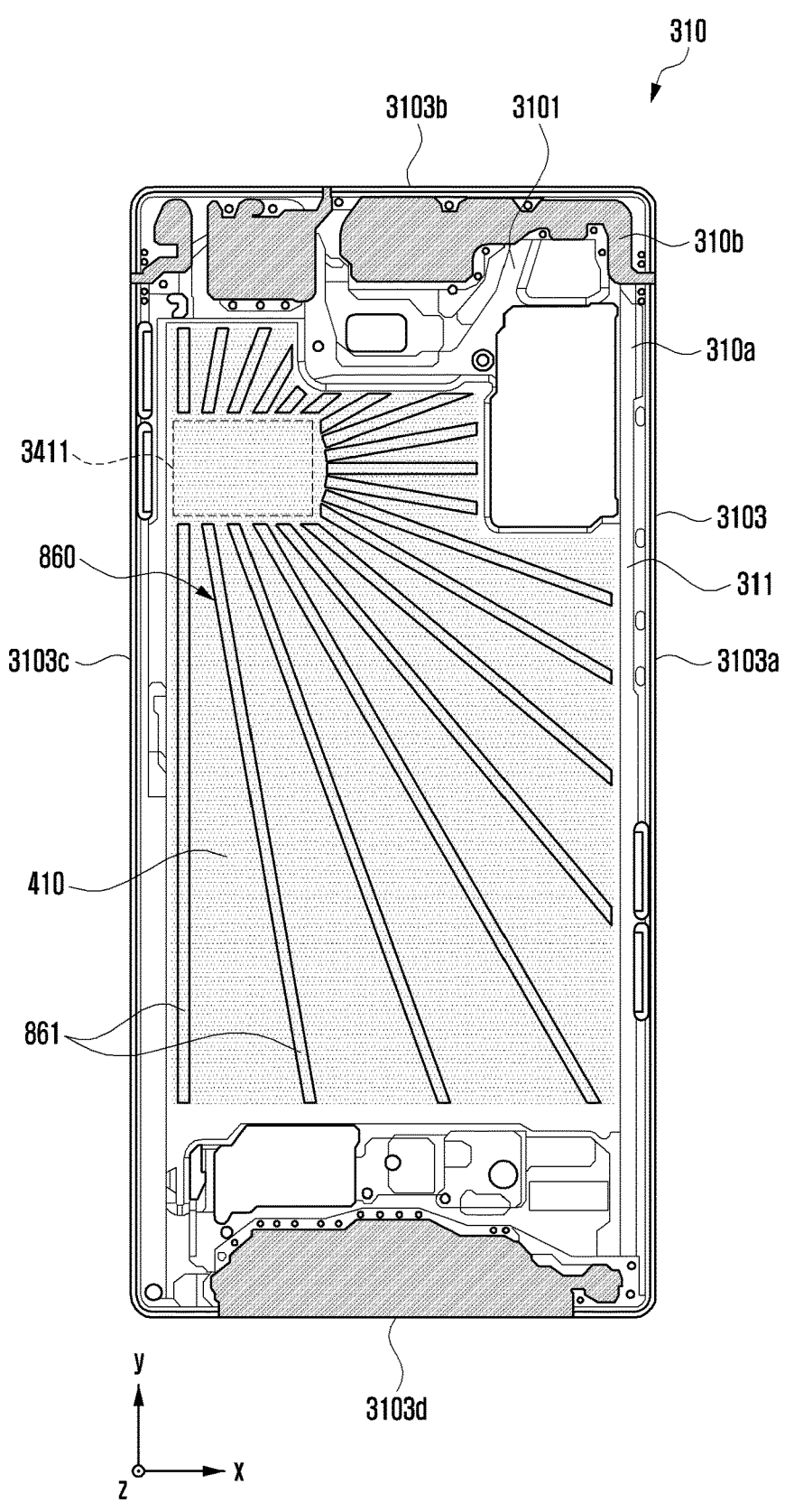

Referring to FIG. 8D, the lateral member 310 may include
a pattern 860 including multiple recesses 861 provided in a
predetermined direction on the first surface 3101 of the
support member 311 and a first heat dissipation coating layer
410 laminated on the first surface 3101 to include at least the
pattern 860. According to an embodiment, the multiple
recesses 861 may be provided to have a length in a radial
direction from an area of the first surface 3101 that at least
partially overlaps the electric element 3411 when the first
surface 3101 is viewed from above. Therefore, heat gener-
ated from the electric element 3411 may be guided to the
first heat dissipation coating layer 410 and the conductive
portion 310a of the support member 311 and may then be
rapidly diffused to the surrounding area through the multiple
radial recesses 861.

Figure 9A:
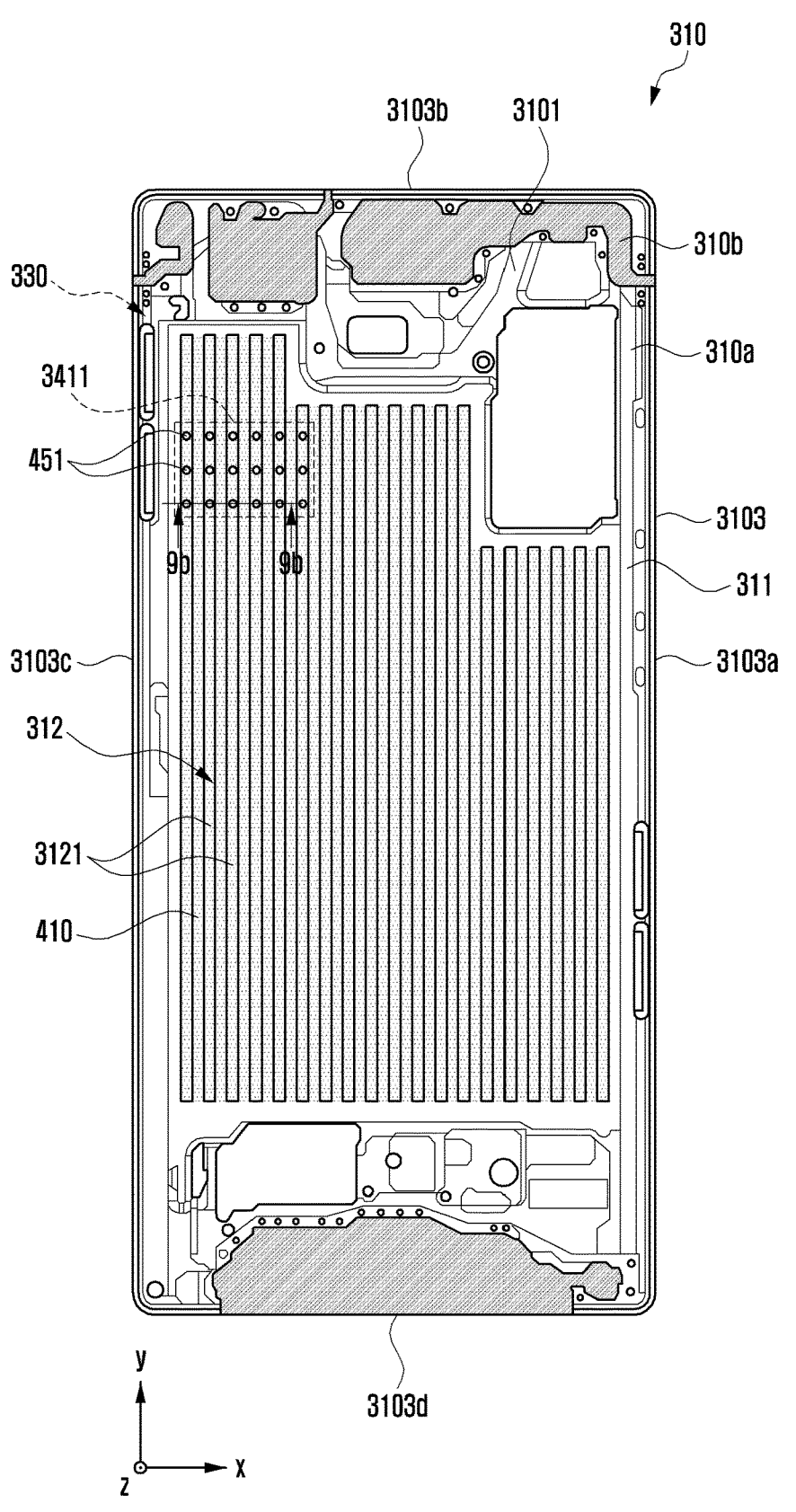
FIG. 9A is a view illustrating a configuration of a lateral member including multiple through holes according to various embodiments of the disclosure.
Figure 9B:
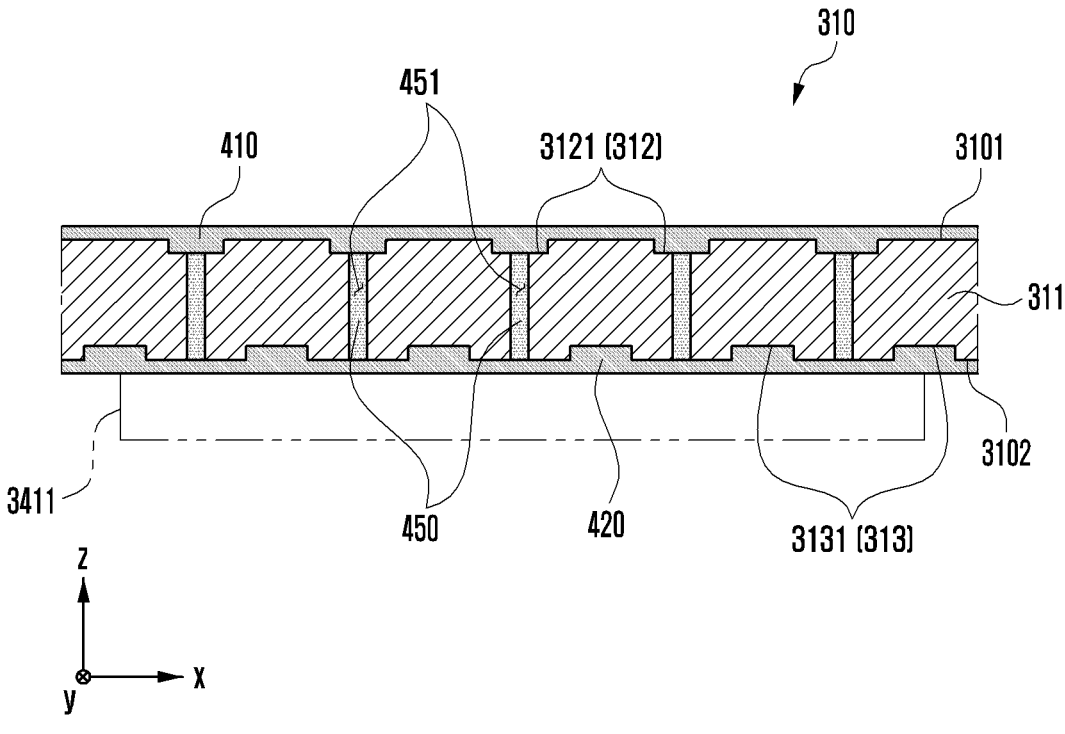
FIG. 9B is a partial cross-sectional view of the lateral member according to various embodiments of the disclosure taken along line 9b-9b in FIG. 9A.

FIG. 9A is a view illustrating a configuration of a lateral
member including multiple through holes according to vari-
ous embodiments of the disclosure. FIG. 9B is a partial cross-sectional view of the lateral member according to various embodiments of the disclosure taken along line 9b-9b in FIG. 9A.

In describing the lateral members 310 of FIGS. 9A and 9B, the same reference numerals are assigned to components that are substantially the same as those of the lateral member 310 of FIG. 4A, and a detailed description thereof may be omitted.

Referring to FIGS. 9A and 9B, the lateral member 310 may include a first pattern 312 including multiple first recesses 3121 provided on a first surface 3101 of a support member 311 and a first heat dissipation coating layer 410 laminated on the first surface 3101. According to an embodiment, the lateral member 310 may include a second pattern 313 including multiple second recesses 3131 provided on a second surface 3102 of the support member 311 and a second heat dissipation coating layer 420 laminated on the second surface 3102. According to an embodiment, the lateral member 310 may include one or more through holes 451 provided to penetrate the support member 311 from the first surface 3101 to the second surface 3102 of the same. According to an embodiment, the one or more through holes 451 may include multiple through holes 451 disposed in an area that at least partially overlaps the electric element 3411 when the first surface 3101 is viewed from above. According to an embodiment, the through holes 451 may be at least partially filled with a third heat dissipation coating layer 450. For example, the third heat dissipation coating layer 450 may contain substantially the same material as the first heat dissipation coating layer 410 and/or the second heat dissipation coating layer 420. In some embodiments, the third heat dissipation coating layer 450 may contain a material (e.g., a metal material) having a thermal conductivity superior to that of the conductive portion 310a of the support member 311. Therefore, the heat generated from the electric element 3411 arranged to be in close proximity to or in contact with the second heat dissipation coating layer 420 may be quickly diffused to the surroundings through the second heat dissipation coating layer 420, the third heat dissipation coating layer 450, and the first heat dissipation coating layer 410. In some embodiments, the first pattern 312 and/or the second pattern 313 may be replaced with at least one of the patterns 810, 820, 830, 840, 850, and 860 described above with reference to FIGS. 8A to 8D.

According to various embodiment, an electronic device (e.g., the electronic device 300 in FIG. 3) may include a housing (e.g., the housing 110 in FIG. 1), a support member (e.g., the support member 311 in FIG. 3) disposed in the inner space (e.g., the inner space 3001 in FIG. 6) of the housing and including a first surface (e.g., the first surface 3101 in FIG. 3) facing a first direction (e.g., the z-axis direction in FIG. 3) and a second surface (e.g., the second surface 3102 in FIG. 3) facing a second direction (e.g., the −z-axis direction in FIG. 3) opposite to the first surface, at least one pattern (e.g., the first pattern 312 of FIG. 4A and/or the second pattern 313 of FIG. 4B) provided in at least a portion of the first surface and/or the second surface of the support member to have a length in at least one predetermined direction, and a heat dissipation coating layer (e.g., the first heat dissipation coating layer 410 of FIG. 4A and/or the second heat dissipation coating layer 420 in FIG. 4B) laminated on the first surface and/or the second surface on which the at least one pattern is provided. The at least one pattern may include multiple recesses (e.g., the multiple first recesses 3121 of FIG. 4A and the multiple second recesses 3131 of FIG. 4B) spaced apart from each other by a predetermined interval and provided to be lower than the first surface and/or the second surface.

According to various embodiment, the heat dissipation coating layer may be laminated to correspond to shapes of the multiple recesses.

According to various embodiment, the heat dissipation coating layer may be laminated to fill the multiple recesses and then to have a surface parallel to the first surface and/or the second surface.

According to various embodiment, the heat dissipation coating layer may include a copper plating layer containing carbon mixed in a predetermined ratio.

According to various embodiment, the multiple recesses may be provided to have a length along a direction parallel to a length direction of the electronic device.

According to various embodiment, the at least one pattern may include a first pattern including multiple first recesses provided in the first surface and/or the second surface to have a length along a third direction, and a second pattern including multiple second recesses provided in the first surface and/or the second surface to have a length along a fourth direction different from the third direction.

According to various embodiment, the first pattern and the second pattern may be disposed in different areas of the support member.

According to various embodiment, the first pattern may be arranged to at least partially cross the second pattern.

According to various embodiment, the electronic device may include at least one electric element disposed in the inner space, and wherein the multiple recesses may have a length in a radial direction from a portion overlapping the electric element when the first surface is viewed from above.

According to various embodiment, the multiple recesses may be provided linearly.

According to various embodiment, the multiple recesses may be provided non-linearly.

According to various embodiment, the multiple recesses may include multiple first recesses disposed on the first surface, and multiple second recesses disposed on the second surface. The multiple first recesses may not at least partially overlap the multiple second recesses when the first surface is viewed from above.

According to various embodiment, the support member may further include at least one through hole at least partially provided therein, and the heat dissipation coating layer may include a first heat dissipation coating layer disposed on the first surface, a second heat dissipation coating layer disposed on the second surface, and a third heat dissipation coating layer at least partially filled in the at least one through hole. The first heat dissipation coating layer disposed on the first surface may be thermally connected to the second heat dissipation coating layer via the third heat dissipation coating layer.

According to various embodiment, the electronic device may include a first electric element disposed in the inner space corresponding to the first surface and thermally connected to the first heat dissipation coating layer, and a second electric element disposed in the inner space corresponding to the second surface and thermally connected to the second heat dissipation coating layer. The first electric element may be disposed at a position that does not overlap the second electric element when the first surface is viewed from above.

According to various embodiment, the electronic device may include at least one electric element disposed in the inner space, and a heat transfer member disposed between the at least one electric element and the heat dissipation coating layer, and the heat transfer member may be thermally connected to the at least one electric element and/or the heat transfer member.

According to various embodiment, the heat transfer member may be disposed to be in contact with the at least one electric device and the heat dissipation coating layer.

According to various embodiment, the width of each of the multiple recesses may be equal to or smaller than the interval between the multiple recesses.

According to various embodiment, the housing may include a front cover disposed to at least partially correspond to the first surface, a rear cover disposed to at least partially correspond to the second surface, and a lateral member surrounding the inner space between the front cover and the rear cover. The support member may extend from the lateral member to the inner space.

According to various embodiment, the lateral member and/or the support member may be at least partially made of a metal material.

According to various embodiment, the electronic device may include a display between the first surface and the front cover in the inner space to be at least partially visible from the outside through the front cover.

The embodiments of the disclosure disclosed in this specification and drawings are provided merely to propose specific examples in order to easily describe the technical features according to the embodiments of the disclosure and to help understanding of the embodiments of the disclosure, and are not intended to limit the scope of the embodiments of the disclosure. Accordingly, the scope of the various embodiments of the disclosure is to be construed in such a manner that, in addition to the embodiments disclosed herein, all changes or modifications derived from the technical idea of the various embodiments of the disclosure are included in the scope of the various embodiments of the disclosure.

What is claimed is:

1. An electronic device comprising:
a housing;
a support member disposed in an inner space of the housing and comprising a first surface facing a first direction and a second surface facing a second direction opposite to the first direction;
at least one pattern provided in at least one of a portion of the first surface and a portion of the second surface of the support member to have a length in a predetermined direction; and
a heat dissipation coating layer laminated on at least one of the first surface and the second surface on which the at least one pattern is provided,
wherein the at least one pattern comprises multiple recesses spaced apart from each other by a predetermined interval and provided in at least one of the first surface and the second surface, the multiple recesses having a predetermined depth lower than at least one of the first surface and the second surface,
wherein the at least one pattern comprises:
a first pattern comprising multiple first recesses provided in at least one of the first surface and the second surface to have a length along a third direction; and
a second pattern comprising multiple second recesses provided in at least one of the first surface and the second surface to have a length along a fourth direction that is not parallel to the third direction, and wherein the multiple first recesses and the multiple second recesses are formed on a same surface of the support member, and the same surface of the support member comprises:
a first region comprising only the multiple first recesses having the length along the third direction, among the multiple first recesses and the multiple second recesses; and
a second region, different from the first region, and comprising only the multiple second recesses having the length along the fourth direction, among the multiple first recesses and the multiple second recesses.

2. The electronic device of claim 1, wherein the heat dissipation coating layer is further laminated to correspond to shapes of the multiple recesses.

3. The electronic device of claim 1, wherein the heat dissipation coating layer is further laminated to fill the multiple recesses and to have a surface parallel to at least one of the first surface and the second surface.

4. The electronic device of claim 1, wherein the heat dissipation coating layer comprises a copper plating layer containing carbon mixed in a predetermined ratio.

5. The electronic device of claim 1, wherein the multiple first recesses are provided to have a length along a direction parallel to a length direction of the electronic device.

6. The electronic device of claim 1, wherein the multiple recesses are provided linearly.

7. The electronic device of claim 1, wherein the support member further comprises at least one through hole at least partially provided therein,
wherein the heat dissipation coating layer comprises:
a first heat dissipation coating layer disposed on the first surface;
a second heat dissipation coating layer disposed on the second surface; and
a third heat dissipation coating layer at least partially filled in the at least one through hole, and
wherein the first heat dissipation coating layer disposed on the first surface is thermally connected to the second heat dissipation coating layer via the third heat dissipation coating layer.

8. The electronic device of claim 7, further comprising:
a first electric element disposed in the inner space corresponding to the first surface and thermally connected to the first heat dissipation coating layer; and
a second electric element disposed in the inner space corresponding to the second surface and thermally connected to the second heat dissipation coating layer,
wherein the first electric element is disposed at a position that does not overlap the second electric element when the first surface is viewed from above.

9. The electronic device of claim 1, further comprising:
at least one electric element disposed in the inner space; and
a heat transfer member disposed between the at least one electric element and the heat dissipation coating layer,
wherein the heat transfer member is thermally connected to the at least one electric element and the heat dissipation coating layer.

10. The electronic device of claim 9, wherein the heat transfer member is disposed to be in contact with the at least one electric element and the heat dissipation coating layer.

11. The electronic device of claim 1, wherein a width of each of the multiple recesses is equal to or smaller than the interval between the multiple recesses.

12. The electronic device of claim 1, wherein the housing includes a front cover disposed to at least partially correspond to the first surface, a rear cover disposed to at least partially correspond to the second surface, and a lateral member surrounding the inner space between the front cover and the rear cover, and wherein the support member extends from the lateral member to the inner space.

13. The electronic device of claim 12, wherein the lateral member and/or the support member is at least partially made of a metal material.

14. The electronic device of claim 12, further comprising a display disposed between the first surface and the front cover in the inner space to be at least partially visible from the outside through the front cover.

15. An electronic device comprising:

a housing;

a support member disposed in an inner space of the housing and having a surface facing a first direction;

at least one pattern provided in at least a portion of the surface of the support member to have a length in a predetermined direction; and a heat dissipation coating layer laminated on the surface of the support member on which the at least one pattern is provided, wherein the at least one pattern comprises multiple recesses spaced apart from each other by a predetermined interval and provided on the surface of the support member, the multiple recesses having a predetermined depth lower than the surface of the support member, wherein the at least one pattern comprises:

a first pattern comprising multiple first recesses having a length along a second direction; and a second pattern comprising multiple second recesses having a length along a third direction that is not parallel to the second direction, and wherein the surface of the support member comprises:

a first region comprising only the multiple first recesses having the length along the second direction, among the multiple first recesses and the multiple second recesses; and a second region, different from the first region, and comprising only the multiple second recesses having the length along the third direction, among the multiple first recesses and the multiple second recesses.

* * * * *